US009152497B2

(12) United States Patent
Lee et al.

(10) Patent No.: US 9,152,497 B2
(45) Date of Patent: Oct. 6, 2015

(54) DATA RECOVERY FROM BLOCKS WITH GATE SHORTS

(71) Applicants: Dana Lee, Saratoga, CA (US); Abhijeet Manohar, Bangalore (IN)

(72) Inventors: Dana Lee, Saratoga, CA (US); Abhijeet Manohar, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 102 days.

(21) Appl. No.: 13/974,997

(22) Filed: Aug. 23, 2013

(65) Prior Publication Data

US 2015/0058698 A1    Feb. 26, 2015

(51) Int. Cl.
G11C 29/00 (2006.01)
G06F 11/10 (2006.01)
G11C 16/34 (2006.01)
G11C 29/50 (2006.01)
G11C 29/04 (2006.01)

(52) U.S. Cl.
CPC ........ G06F 11/1068 (2013.01); G06F 11/1048 (2013.01); G11C 16/3431 (2013.01); G11C 29/00 (2013.01); G11C 29/50004 (2013.01); G11C 29/50008 (2013.01); G11C 2029/0411 (2013.01); G11C 2029/5002 (2013.01)

(58) Field of Classification Search
CPC . G11C 29/00; G06F 11/1068; G06F 11/0793; G06F 11/07
USPC .......................................... 714/721; 365/200
See application file for complete search history.

(56) References Cited

U.S. PATENT DOCUMENTS

| 7,157,957 | B2 * | 1/2007 | Kim .............................. 327/390 |
| 7,466,610 | B2 * | 12/2008 | Umezawa et al. ............. 365/200 |
| 7,881,112 | B2 * | 2/2011 | Hsu et al. .................. 365/185.15 |
| 2008/0192544 | A1 * | 8/2008 | Berman et al. ........... 365/185.09 |
| 2009/0016111 | A1 | 1/2009 | Kim et al. |
| 2012/0281479 | A1 | 11/2012 | Kochar et al. |
| 2013/0028021 | A1 | 1/2013 | Sharon et al. |
| 2013/0031429 | A1 | 1/2013 | Sharon et al. |

OTHER PUBLICATIONS

Park, Ki-Tae; Jong-Sun Sel; Jungdal Choi; Yunheub Song; Changhyun Kim; Kim, Kinam, "A Novel nand Flash Memory With Asymmetric S/D Structure Using Fringe-Field-Induced Inversion Layer," Electron Devices, IEEE Transactions on , vol. 55, No. 1, pp. 404,410, Jan. 2008.*
A Method for Recovering From Errors in Flash Memory Authors et. al.: Disclosed Anonymously IP.com No. IPCOM000141800D IP.com Electronic Publication: Oct. 15, 2006.*

* cited by examiner

Primary Examiner — Cynthia Britt
(74) Attorney, Agent, or Firm — Brinks Gilson & Lione

(57) ABSTRACT

A storage module may include a NAND-type flash memory array and one or more controllers configured to increase gate bias voltage levels applied to gates in the memory array to overcome possible gate shorts and recover data identified as being uncorrectable. The increased gate bias voltages may be applied to gates of a single type of transistor or to different types of transistors in the memory array, including drain select transistors, source select transistors, or floating gate transistors.

18 Claims, 6 Drawing Sheets

US 9,152,497 B2

DATA RECOVERY FROM BLOCKS WITH GATE SHORTS

BACKGROUND

Storage modules may store and manage storage of data in memory arrays in response to commands received from a host, such as program, read, and erase commands. When a read command is received, data may be retrieved from the memory array that an error correction code (ECC) engine may identify as having uncorrectable errors. These uncorrectable errors may occur for various reasons. One reason may be that there is a gate short in the memory array, which may span across multiple wordlines in the array.

SUMMARY

Embodiments of the present invention are defined by the claims, and nothing in this section should be taken as a limitation on those claims. By way of example, the embodiments described in this document and illustrated in the attached drawings generally relate to a storage module and related methods of increasing levels of gate bias voltages in NAND-type flash memory to overcome gate shorts and recover data.

In one example, a method of recovering data from a NAND-type flash memory array may include, in response to an uncorrectable error determined by an error correction code (ECC) module for a first set of data read from the NAND-type flash memory array in response to a read command: increasing a gate bias voltage supplied to the NAND-type flash memory array from an initial voltage level to an increased voltage level; and determining, with at least one controller, that the uncorrectable error is overcome in response to the gate bias voltage being supplied to the NAND-type flash memory array at the increased voltage level.

In another example, a storage module may include a NAND-type flash memory array, and at least one controller configured to: receive a read command from a host to read a first set of data from the NAND-type flash memory array, and determine an uncorrectable error for the first set of data in response to an initial execution of the read command. In response to determination of the uncorrectable error, the one or more controllers may further be configured to increase a gate bias voltage supplied to the NAND-type flash memory array from an initial level to an increased level in accordance with a gate short detection scheme, wherein the uncorrectable error may be overcome in response to supply of the gate bias voltage to the NAND-type flash memory array at the increased level.

In another example, a storage module may include a non-volatile memory module that includes a NAND-type flash memory array and a memory controller. The storage module may also include a storage module controller in communication with the non-volatile memory module. The storage module controller may be configured to: determine an uncorrectable error for a first set of data read from the NAND-type flash memory array in response to a read command; and instruct the memory controller to perform gate short detection in response to determination of the uncorrectable error. In response to receipt of the instruction, the memory controller may be configured to: unselect all wordlines in the NAND-type flash memory array associated with execution of the read command; and sense a second set of data when a gate bias voltage is supplied to the NAND-type flash memory at an increased voltage level, where the second set of data being is when all of the wordlines associated with execution of the read command are unselected. The memory controller may also be configured to determine that the uncorrectable error is overcome based on a comparison of the sensed second set of data with a third set of data. The third set of data may be an expected set of data to be sensed when all of the wordlines associated with execution of the read command are unselected.

In sum, a storage module may be configured to recover data requested from a read command that was identified as having uncorrectable errors by increasing gate bias voltage levels to overcome possible gate shorts in NAND-type flash memory.

These and other embodiments, features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Various modifications to and equivalents of the embodiments described and shown are possible and various generic principles defined herein may be applied to these and other embodiments. Thus, the claimed invention is to be accorded the widest scope consistent with the principles, features, and teachings disclosed herein.

Figure 1:
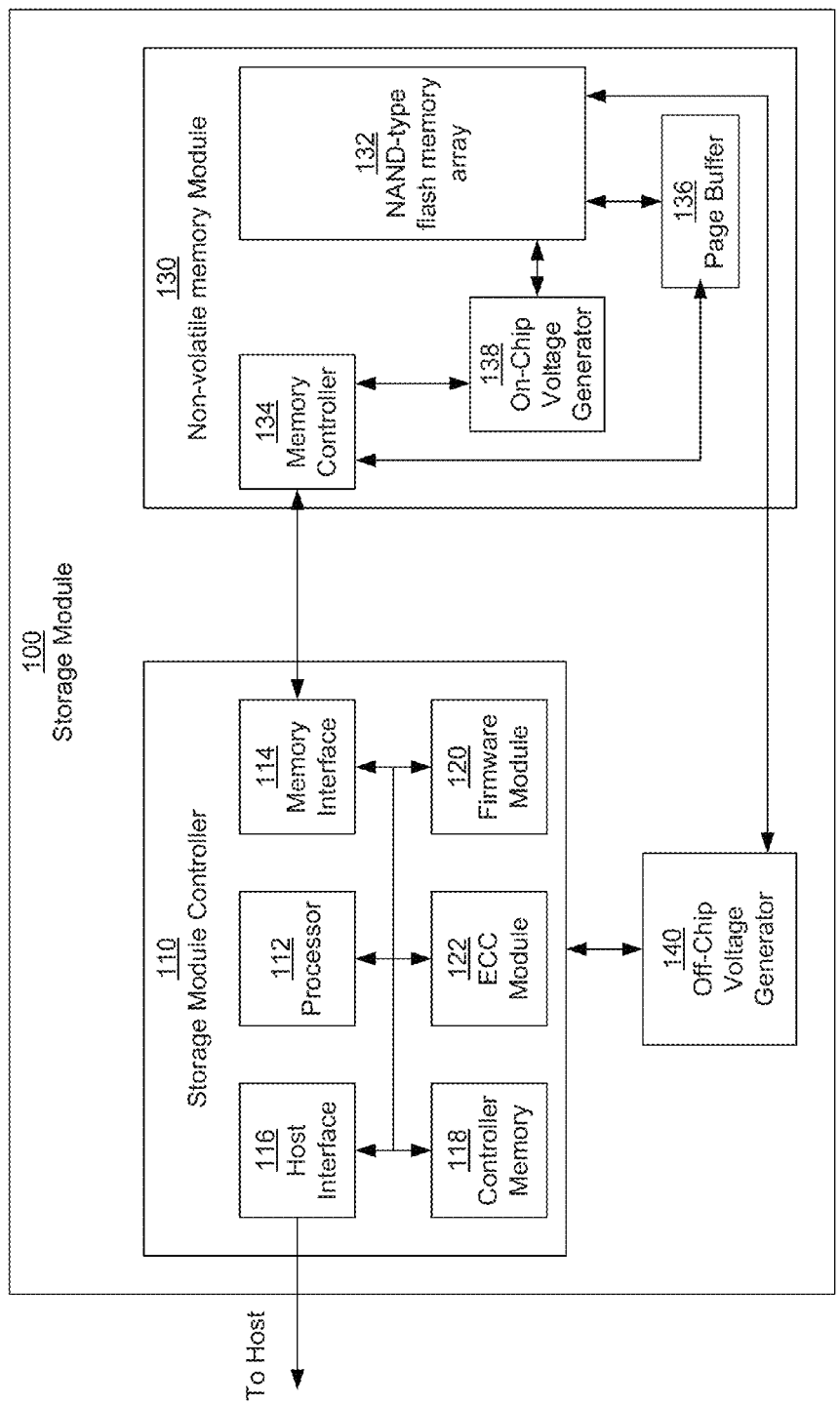
FIG. 1 is a block diagram of an example storage module.

The present description describes a storage module that includes a NAND-type flash memory array and one or more controllers configured to increase gate bias voltage levels applied to gates in the memory array to overcome possible gate shorts and recover data identified as being uncorrectable. FIG. 1 shows a block diagram of an example embodiment of a storage module 100 that includes a storage module controller 110, a non-volatile memory module 130, and a voltage generator 140. The storage module controller 110 may include a processor 112 that is configured to control and manage storage of data in the storage module 100. The processor 112 may include a single processor or a plurality of processors configured to perform various types of processing, such as multi-processing, multi-tasking, parallel processing, remote processing, distributed processing, or the like, to perform the functions and operations of the one or more controllers. Also, the one or more controllers may be configured to execute program instructions that may be part of software, hardware, micro-code, firmware, or the like in order to perform at least some of the function or operations.

In addition, the storage module controller 110 may include a memory interface 114 that interfaces with the non-volatile memory module 130. Also, the storage module controller 110 may include a host interface 116 that configures the storage module 100 operatively in communication with a host (not shown in FIG. 1). As used herein, the phrase "operatively in communication with" could mean directly in communication with or indirectly in communication with through one or more components, which may or may not be shown or described herein. The processor 112, through or using the host interface 116, may receive commands, such as read and write commands, from the host, and also send, through or using the host interface 116, responses to commands to the host. Additionally, the host interface 618 may take any suitable form, such as, but not limited to, an eMMC host interface, a UFS interface, and a USB interface, as examples.

Also, some configurations of the storage module controller 110 may include controller memory 118, which may be separate from memory in the non-volatile memory module 130, and which the processor 112 may use or access to perform one or more functions or operations. For example, data may be temporarily stored in the controller memory 118 before being stored in the non-volatile memory module 130 or sent to the host. In addition or alternatively, software and/or firmware including program instructions may be stored in the internal memory 118, which the processor 112 may execute to perform one or more functions. The controller memory 118 may include one or more various types of memory structures or technologies of volatile memory, non-volatile memory, or combinations thereof, including but not limited to random access memory, read-only memory, programmable read-only memory, electrically programmable read-only memory, electrically erasable read-only memory, flash memory (e.g., NAND, NOR, or other flash memories), magnetic tape or disk, optical media, or other memory technologies.

The storage module controller 110 may also include a firmware module 120. The firmware module 120 may include software and/or a set of executable program instructions, which may be stored in the controller memory 118 and/or which the processor 112 may execute or use to perform one or more functions. As described herein, functions or actions performed by the firmware module 120 and functions or actions performed by the processor 112 executing the firmware module 120 may be use interchangeably.

In addition, the storage module controller 110 may include an error correction code (ECC) module or engine 122 that that may be configured to compensate for bits that may spontaneously fail during normal device operation to ensure data integrity. The ECC module 122 may include or be configured to operate in accordance with one or more algorithms. In addition, the ECC module 122 may be implemented in hardware, software, or a combination thereof. For example, the ECC module 122 may be implemented in hardware logic and/or have its own built-in processor dedicated to performing ECC functions. In addition or alternatively, the ECC module 122 may include software, which may be stored in the controller memory 118 and/or which the processor 122 may execute or use to perform all or some of the ECC functions.

The non-volatile memory module 130 may include a NAND-type flash memory array 132. The NAND-type flash memory array 132 may include a plurality of memory cells configured as single-level cells (SLCs) that store a single bit of data per cell, or multi-level cells (MLCs) that store multiple bits of data per cell. Each memory cell may be a floating gate transistor (FGT) that has a floating gate and a control gate. The floating gate may be surrounded by an insulator or insulating material that helps retain charge in the floating gate. The presence or absence of charges inside the floating gate may cause a shift in a threshold voltage of the FGT, which may be used to distinguish a logic "1" from a logic "0." That is, each FGT's threshold voltage may be indicative of the data stored in the memory cell. Hereafter, FGT and memory cell may refer to the same physical entity and/or may be used interchangeably.

The memory cells may be disposed in the NAND-type flash memory array 132 in accordance with a matrix-like structure of rows and columns of memory cells. At the intersection of a row and a column may be a FGT (or memory cell). A column of FGTs may be referred to as a string. FGTs in a string or column may be electrically connected in series. A row of FGTs may be referred to as a page. Control gates of FGTs in a page or row may be electrically connected together.

In addition, the memory array 132 may be organized or partitioned into blocks. In turn, the blocks may be divided into pages. Data may be stored in the memory array 132 as blocks of data or as pages of data. Otherwise stated, FGTs in a block or in a page may store a block or a page of data.

Also, the memory array 132 may include wordlines and bitlines. Each page of FGTs may be coupled to a corresponding wordline. In particular, each wordline may be coupled to the control gates of FGTs in a page. In addition, each string of FGTs may be coupled to a corresponding bitline. That is, each bitline may be coupled to a string of FGTs. Further, multiple wordlines may span across a single string, and the number of FGTs in a string may be equal to the number of pages in a block.

Figure 2:
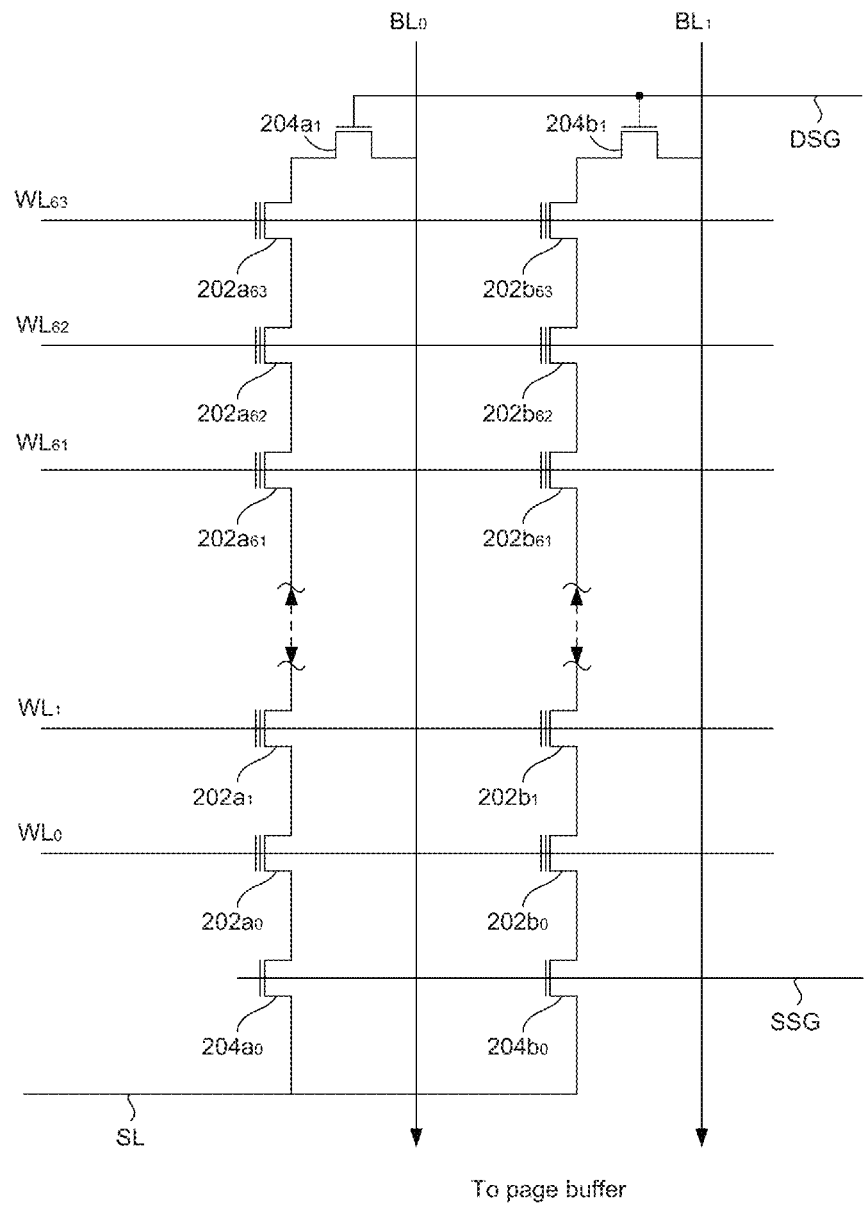
FIG. 2 is a circuit schematic diagram of a portion of a NAND-type flash memory array.

FIG. 2 shows a schematic diagram of a portion of the NAND-type flash memory 132. The portion shown in FIG. 2 includes a first string of sixty-four FGTs $202a_0$ to $202a_{63}$ connected in series and a second string of sixty-four FGTs $202b_0$ to $202b_{63}$ connected in series. Numbers other than sixty-four FGTs per string may alternatively be used. The first string is coupled to a first bitline $BL_0$. The second string is coupled to a second bitline $BL_1$. Additionally, the portion shown in FIG. 2 includes sixty-four wordlines $WL_0$ to $WL_{63}$ coupled to sixty-four pages of FGTs. Wordline $WL_0$ is coupled to control gates FGTs in a first page comprising FGT $202a_0$ and $202b_0$, wordline $WL_1$ is coupled to control gates of FGTs in a second page comprising FGT $202a_1$ and $202b_1$, and so on.

To perform a read operation, a page of FGTs and a corresponding wordline may be selected, and current sensing of bitlines may be employed to determine whether a floating gate of a FGT in the selected page contains charge or not. To do so, the selected wordline may supply zero volts to the control gates of the FGTs to which the selected wordline is coupled, and the unselected wordlines may drive the control gates of the FGTs to which they are coupled with a wordline bias voltage $V_{read}$. The wordline bias voltage $V_{read}$ may be a threshold gate bias voltage set to a level to turn on the FGT. In a given string, if the floating gate of a FGT coupled to the selected wordline (referred to as a selected FGT or a target FGT in a string) does not contain charge, then the selected FGT may be "on" and current may flow through the string. Alternatively, if the floating gate of the selected FGT does not contain charge, then the selected FGT may be "off" and current may not flow through the string. A selected FGT that is "on" may correspond to a logic value of "1," and a selected FGT that is "off" may correspond to a logic value of "0." Accordingly, a logic "1" associated with the selected FGT may be read or identified when a presence of current flow through the string is sensed, and a logic "0" associated with the FGT may be read or identified when an absence of current flow through the string is sensed.

Current flowing through a string may flow from a source line SL, through the string, to the bitline BL to which the string is coupled. The string may be coupled to the source line SL via a source select transistor and may be coupled to its associated bitline BL via a drain select transistor. For example, as shown in FIG. 2, the first string of FGTs $202a_0$ to $202a_{63}$ may be coupled to the source line SL via a source select transistor $204a_0$ that is connected to the source line SL and a first end FGT $202a_0$ of the first string. In addition, the first string of FGTs $202a_0$ to $202a_{63}$ may be coupled to the first bitline $BL_0$ via a drain select transistor $204a_1$ that is connected to the first bitline $BL_0$ and a second end FGT $202a_{63}$. Similarly, the second string of FGTs $202b_0$ to $202b_{63}$ may be coupled to the source line SL via a source select transistor $204b_0$ that is connected to the source line SL and a first end FGT $202b_0$ of the second string. In addition, the second string of FGTs $202b_0$ to $202b_{63}$ may be coupled to the second bitline $BL_1$ via a drain select transistor $204b_1$.

For a given string, current may flow through the string when its associated source select and drain select transistors are both closed or "on." Alternatively, current may be prevented from flowing through the string when one or both of the associated source select and drain select transistors are open or "off." Switching of the source select transistors $204a_0$, $204b_0$ may be controlled using a source select gate bias line SSG. In particular, the source select bias line SSG may supply a source select gate bias voltage $V_{SSG}$ to the gates of the source select transistors $204a_0$, $204b_0$, which may be a threshold voltage applied to the gates to turn "on" the source select transistors $204a_0$, $204b_0$. Additionally, switching of the drain select transistors $204a_1$, $204b_1$ may be controlled using a drain select gate bias line DSG. In particular, the drain select bias line DSG may supply a drain select gate bias voltage $V_{DSG}$ to the gates of the drain select transistors $204a_1$, $204b_1$, which may be a threshold voltage applied to the gates to turn "on" the drain select transistors $204a_1$, $204b_1$.

Referring back to FIG. 1, the non-volatile memory module 130 may further include a memory controller 134 configured to control and/or manage the storage of data in the memory array 132. The memory controller 134 may provide an interface between the storage module controller 110 and the memory array 132. Additionally, the memory controller 134 may control and/or manage the storage of data in the memory array 132 in response and/or according instructions or commands, such as read, program, and/or erase commands, received from the storage module controller 110. The memory controller 134 may be configured to perform various functions to control and/or manage the data storage, including, but not limited to, addressing, data transfer, sensing, row and column decoding, and/or gate biasing. Additionally, the memory controller 134 may be implemented in hardware, including a processor, hardware logic and/or other circuitry to perform the functions of the memory controller 134.

In addition, the non-volatile memory module 130 may include a page buffer 136 coupled to the bitlines BL of the memory array 132. The page buffer 136, which may include sense amplifiers, latches, and/or other similar circuitry, may be configured to store data that is transferred to and from the memory array 132 (such as by use of the latches), and may sense current flow through the bitlines BL (such as by use of the sense amplifiers). The non-volatile memory module 130 may also include a voltage generator 138 that is configured to supply one or more bias voltages to the memory array 132. For example, the voltage generator 138 may be coupled to one or more of the wordlines WL to supply the wordline bias voltage $V_{read}$ to the control gates of the memory cells, the source select gate bias line SSG to supply the source select gate bias voltage $V_{SSG}$ to the gates of the source select transistors $204a_0$, $204b_0$, and/or the drain select gate bias line DSG to supply the drain select gate bias voltage $V_{DSG}$ to the gates of the drain select transistors $204a_1$, $204b_1$. The memory controller 134 may control operation of the voltage generator 138.

The voltage generator 140 of the storage module 100 may additionally or alternatively be used to supply all or at least some of the gate bias voltages. For some example configurations, the voltage generator 138 may be configured to supply some of the gate bias voltages, while the voltage generator 140 may be configured to supply the other gate bias voltages. To illustrate, the voltage generator 138 of the non-volatile memory module 130 may be configured to supply the wordline bias voltages $V_{read}$ while the voltage generator 140 of the storage module 100 is configured to supply the source and drain select gate bias voltage $V_{SSG}$, $V_{DSG}$. In alternative example configurations, the voltage generator 138 may supply all of the gate bias voltages, and the voltage generator 140 may not supply any of the gate bias voltages. In still other alternative example configurations, the voltage generator 140 may supply all of the gate bias voltages, and the voltage generator 138 may not supply any of the gate bias voltages.

One difference between the voltage generator 138 and the voltage generator 140 may be that the voltage generator 138 is on the same chip or is "on-chip" with the memory array 132 and the memory controller 134, whereas the voltage generator 140 may not be on the same ship or is configured in the storage module 100 "off-chip" from the memory array 132 and the memory controller 134. Hereafter, the voltage generator 138 is referred to as the on-chip voltage generator, and the voltage generator 140 is referred to as the off-chip voltage generator. An additional or alternative difference may be that the on-chip voltage generator 138 may be controlled by the memory controller 134, whereas the off-chip voltage generator 140 may be controlled by the storage module controller 110.

In response to a read command received from the storage module controller 110, the memory controller 134 may send data stored in the page buffer 136 to the storage module controller 110, where the ECC module 122 may perform error checking on the data. When performing error checking on the data, the ECC module 122 may detect or identify errors in the data that is read. The errors may occur for various reasons. One reason may be that there is a gate short of a transistor in the memory array 132, including a FGT, a source select transistor, or a drain select transistor. A gate short may be an electrical short between a gate of a transistor and another node in the memory array 132, such as the substrate of the memory chip, a dummy node that is not an active part of the memory array 132, one of the bitline BLs, the source line SL, or a node near a ground line, as examples. When a gate short occurs, the ECC module 122 may be unable to correct the error and/or recover the data, such as through parity, because the error covers multiple wordlines WLs and/or multiple pages of data. Accordingly, the ECC module 122 may identify the error as an uncorrectable error or an uncorrectable ECC (UECC).

A gate short and/or read errors resulting from a gate short may be overcome by increasing a gate bias voltage applied to a transistor in the memory array 132 having the gate short. Increasing a gate bias voltage to overcome a gate short may be generally referred to as gate short detection. Any gate bias voltage applied to a transistor in the memory array 132 may be subjected to gate short detection. Example gate bias voltages may include the drain select gate bias voltage $V_{DSG}$ applied to the gate of the drain select transistors, the source select gate bias voltage $V_{SSG}$ applied to the gate of the source select transistors, the wordline bias voltage $V_{read}$ applied to the wordlines WLs, as well as any other gate bias voltages that may be applied to the gates of transistors in the memory array 132, such as the gate bias voltage Vgp, which may be applied to end FGTs in a string.

The gate bias voltage subjected to gate short detection may be increased from an initial or default level to a level determined to be sufficiently high. A sufficiently high gate bias voltage level may be a level that overcomes the gate short and causes current to flow through the transistor when the gate bias voltage is applied. Conversely, an insufficiently high gate bias voltage level may be a level that does not overcome the gate short, and current may be prevented from flowing through the transistor when the insufficiently high gate bias voltage is applied to the transistor.

As an illustration, referring to FIG. 2, if the drain select transistor $204a_1$ has a gate short between its gate and another node, such as the first bitline $BL_1$, the gate short may prevent current from flowing through the drain select transistor $204a_1$ when an insufficiently high drain select gate bias voltage $V_{DSG}$ is applied to the gate of the drain select transistor $204a_1$. However, the gate short may be overcome by increasing the drain select gate bias voltage $V_{DSG}$ to a sufficiently high voltage level. Once the drain select gate bias voltage $V_{DSG}$ is increased to a sufficiently high level, the gate short may be overcome and current may flow through the drain select transistor $204a_1$.

When the ECC module 122 detects a UECC, the firmware module 120 may send a command to the memory controller 134 via the memory interface 114 that instructs the memory controller 134 to perform gate short detection in an attempt to correct the error. In response to receipt of the command, the memory controller 134 may be configured to sense data from one or more pages in the memory array 132 and compare the sensed data to anticipated or expected data. The memory controller 134 may sense the data by identifying data that is stored in the page buffer 136 in response to a predetermined gate biasing. The expected data that is compared with the sensed data may be data that is expected to be sensed in response to the predetermined gate biasing.

If the sensed data matches the expected data, at least within an error margin, then the memory controller 134 may determine that the gate bias voltage is set at a sufficiently high level, and the data may be properly read from the one or more pages in the memory array 132. Hereafter, a match between the sensed data and the expected data may refer to a perfect or an exact match, or a match that is within a predetermined acceptable error margin. The predetermined acceptable error margin may be based on whether or not the ECC module 122 can correct the error. Alternatively, if the sensed data does not match the expected data (or falls outside of the predetermined acceptable error margin), then the gate bias voltage may be increased or stepped up. The increase or step up in gate bias voltage may be by a predetermined amount. For some examples configurations, the predetermined amount may correspond to a single digital-to-analog converter (DAC) voltage level. After the voltage is increased, the memory controller 134 may again sense the data and compare the sensed data to the expected data. The comparison and step up in voltage may be repeated until a match occurs between the sensed data and the expected data, or until the gate bias voltage is stepped up to a predetermined maximum level, at which point the gate bias voltage may no longer be increased even though a match has not been identified.

The predetermined gate biasing used to determine or generate the expected data may be determined or generated in accordance with a predetermined gate short detection scheme. For some example configurations, the gate short detection scheme may include unselecting all of the wordlines WLs, which in turn may include applying the wordline bias voltage $V_{read}$ to each of the wordlines WLs. To illustrate, referring to FIG. 2, unselecting all of the wordlines WLs may include applying the wordline bias voltage $V_{read}$ to each of the sixty-four wordlines $WL_0$ to $WL_{63}$. For a given string, when all of the wordlines WL are unselected, if none of the transistors in the string, including the FGTs and the source and drain select transistors, have a gate short, current may flow through the string, resulting in sensing of a logic "1" value for that string. Accordingly, where all of the wordlines WLs are unselected, the data that is expected to be sensed may include a plurality of logic "1" values, each associated with a string. This expected data of all logic "1" values may be referred to as "FF data."

When sensing data, if all of the wordlines WLs are unselected, but one or more logic "0"s are detected due to sensing of an absence of current flow through one or more strings, a difference between the FF data and the sensed data including more or more logic "0" values may exist. This difference may be indicative of one or more gate shorts. A difference between the FF data and the sensed data that falls outside an acceptable margin of error may indicate uncorrectable errors or a UECC due to gate shorts. On the other hand, a difference between the FF data and the sensed data that falls within an acceptable margin of error may indicate an amount of errors that may be corrected by the ECC module 122. A perfect match (i.e., no difference) between the FF data and the sensed data may indicate no gate shorts. If, under initial voltage bias settings, a difference between the FF data and the sensed data is outside the acceptable margin of error, but is then eliminated or reduced to falling within the acceptable margin of error when the gate bias voltage is increased, the UECC that resulted from the gate short may be identified as being overcome.

In addition to unselecting all of the wordlines WLs, the gate short detection scheme may identify the transistor in a string on which to perform gate short detection, which in turn may identify which gate bias voltage levels to keep constant, and which voltage levels to increase until a match between the sensed and expected data is determined. In particular, when testing the drain select transistors for gate shorts, the wordline bias voltage $V_{read}$ and the source select gate bias voltage $V_{SSG}$ may be held at respective constant levels, while the drain select gate bias voltage $V_{DSG}$ may be increased until a match between the sensed and expected data is determined. Similarly, when testing the source select transistors for gate shorts, the wordline bias voltage $V_{read}$ and the drain select gate bias voltage $V_{DSG}$ may be held at respective constant levels, while the source select gate bias voltage $V_{SSG}$ may be increased until a match between the sensed and expected data is determined. Likewise, when testing the FGTs for gate shorts, the source select gate bias voltage $V_{SSG}$ and the drain select gate bias voltage $V_{DSG}$ may be held at respective constant levels, while the source select gate bias voltage $V_{SSG}$ may be increased until a match between the sensed and expected data is determined.

Additionally, some example gate short detection schemes may identify an order in which the transistors in a string are tested. To illustrate, the gate short detection scheme may identify that the drain select transistor is tested first, the source select transistor is tested second, and the FGTs are tested third (i.e., last). Other orders may be used. If a match between the sensed data and the expected data is determined, gate short detection may cease and any remaining transistors in the order that have not been tested for gate shorts may not be tested for gate shorts. Alternatively, if the predetermined maximum gate bias voltage level has been reached and a match has not been determined, then gate short testing may proceed to the next transistors (or set of transistors) in the order.

To illustrate, using the example order above, gate short detection may be performed on the drain select transistor first. Initial levels for the drain select gate bias voltage $V_{DSG}$, the source select gate bias voltage $V_{SSG}$, and the wordline bias voltage $V_{read}$ may be applied to their respective levels. If a match is not determined when the initial levels are applied, the source select gate bias voltage $V_{SSG}$ and the wordline bias voltage $V_{read}$ may be held constant while the drain select gate bias voltage $V_{DSG}$ is increased until a match is determined. If a match is determined, then gate short detection on the drain select transistor may stop, and gate short detection may not be performed on the source select transistor or the FGTs. Alternatively, if the drain select gate bias voltage $V_{DSG}$ is increased to a predetermined maximum level without a match being determined, then the gate short detection on the drain select transistor may stop, and gate short detection may then be performed on the source select transistor in accordance with the order of the gate short detection scheme. Subsequently, gate short detection may or may not proceed to the FGTs, depending on whether a match between the sensed data and the expected data is determined when the source select gate bias voltage $V_{SSG}$ is increased.

Some gate short detection schemes may not include or identify all of the transistors in a string for gate short detection. For example, some gate short detection schemes may only test the drain and source select transistors for gate shorts, but exclude the FGTs. Other gate short detection schemes may only test the FGTs and one but not both of the drain and source select transistors. Still other gate short detection schemes may identify only one of the transistors—i.e., the gate short detection may be performed on only the drain source select transistor, only the source select transistor, or only the FGTs. Various gate short detection schemes or combinations of gate short detection schemes may be possible.

For some example configurations, the firmware module 120 may configure the storage module 100 in a test mode of operation in order for the gate short detection scheme to be executed or implemented. The test mode may be distinguished from a user mode of operation, in which the memory controller 134 may be unable to execute the gate short detection scheme. For example, the storage module 100 may be configured in a test mode of operation, instead of a user mode of operation, for the memory controller 134 to unselect all of the wordlines WLs. That is, in the user mode, the memory controller 134 may be unable to unselect all of the wordlines WLs. In alternative configurations, the storage module 100 may not be configured in a test mode or switch from a user mode for the gate short detection scheme to be implemented.

When the memory controller 134 determines a match between the sensed data and the expected data, the memory controller 134 may notify the storage module controller 110, such as the firmware module 120, of the match. The firmware module 120 may instruct the memory controller 134 to perform the read operation again. Alternatively, the memory controller 134 may perform the read operation again without notifying the storage module controller 110 and/or without waiting for instruction from the storage module controller 110 to perform the read operation. If the gate bias voltage was increased or stepped up prior to determination of the match, then the memory controller 134 may perform the subsequent read operation with the gate bias voltage set at the elevated level that yielded the match.

When the memory controller 134 determines a non-match between the sensed data and the expected data, the memory controller 134 may notify the storage module controller 110 of the non-match. Alternatively, the memory controller 134 may withhold notification of the non-match to the storage module controller 110. Whether or not the memory controller 134 notifies the storage module controller 110 of the non-match may depend on whether the on-chip voltage generator 138 or the off-chip voltage generator 140 is supplying the gate bias voltage to be increased in response to the mismatch. If the off-chip voltage generator 140 is supplying the gate bias voltage, then the memory controller 134 may notify the storage module controller 110 of the mismatch. In turn, the storage module controller 110, such as through use of the firmware module 120, may increase or step up the voltage level of the gate bias voltage being supplied by the off-chip voltage generator 140 to a next voltage level. Alternatively, if the on-chip voltage generator 138 is supplying the gate bias voltage, then the memory controller 134 may increase or step up the voltage level of the gate bias voltage being supplied by the on-chip voltage generator 138 to a next voltage level, without notifying the storage module controller 110 of the mismatch.

As previously described, in the event of a match, a subsequent read operation may be performed, and the memory controller 134 may send a response to the subsequent read operation to the storage module controller 110, where the ECC module 122 may perform error checking. Because a match was identified prior to performing the subsequent read operation, the ECC module 122 may not identify a UECC on the data produced from the subsequent read operation, and the data may be identified as being recovered.

In alternative example configurations, some or all of the operations performed by the memory controller 134 may be performed by the storage module controller 110, or vice versa. To illustrate, rather than the memory controller 134 comparing the sensed data with the expected data, the memory controller 134 may alternatively be configured to send the sensed data back to the storage module controller 110, which may compare the sensed data with the expected data. In the event there is not a match, the storage module controller 110 may either increase a gate bias voltage being supplied by the off-chip voltage generator 140 or may instruct the memory controller 134 to increase a gate bias voltage being supplied by the on-chip voltage generator 138. In addition, the storage module controller 110 may notify the memory controller 134 of the comparison results, and in response, the memory controller 134 may sense data again, this time with the increased gate bias voltage. After the data is sensed again, the memory controller 134 then send the sensed data back to the storage module controller 110 for another comparison and possible voltage increase.

Although the above-described operations may be performed by either the storage module controller 110, the memory controller, or some combination thereof, minimizing the amount of operations performed by the storage module controller 110 and/or communication between the storage module controller 110 and the memory controller 134 may optimize performance of the storage module 100 and/or increase the speed and/or efficiency at which the storage module 100 performs gate short detection. As such, a configuration in which the memory controller 134, rather than the storage module controller 110, performs the sensing and comparing operations may be optimal.

Figure 3:
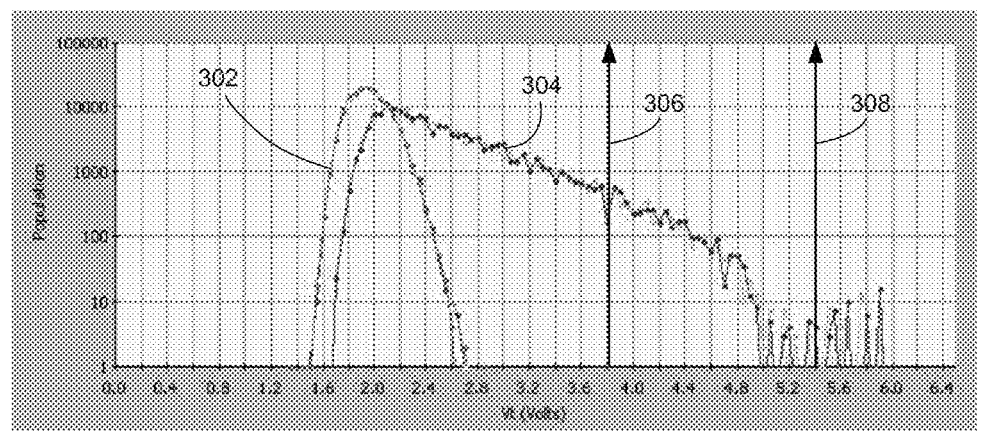
FIG. 3 is a graph of a distribution curves.
Figure 4:
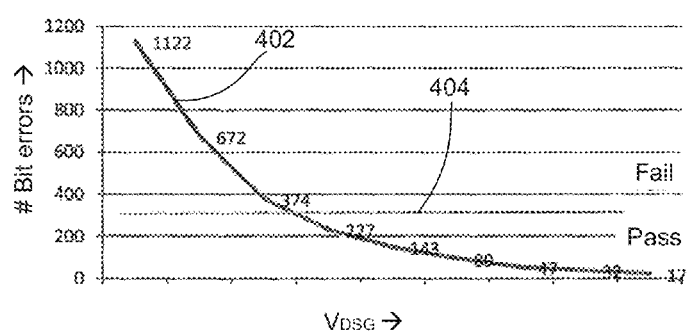
FIG. 4 is a graph of bit error amounts as a function of threshold voltage.

FIGS. 3 and 4 shows graphs of distribution and bit-error number curves that generally illustrate data recovery in the event of a gate short as gate bias voltage levels are increased to sufficiently high levels. The graphs are shown particularly for gate short detection performed on drain select transistors, although similar curves may be generated for gate short detection performed on other transistors, such as source select transistors or FGTs.

FIG. 3 shows a graph of a pair of distribution or histogram curves, including a first distribution curve 302 associated with blocks of "normal" NAND flash that returned data that the ECC module 122 identified as having no UECCs, and a second distribution curve 304 associated with blocks of "defective" NAND flash that returned data that the ECC module 122 identified as having a UECC. The curves 302, 304 are generated for gate short detection on drain select transistors. In addition, the distribution curves 302, 304 are plotted on the graph as a population of bits that turned "on" (logarithmically) as a function of gate bias voltage (or threshold voltage).

As shown in FIG. 3, the first curve 302 associated with the "normal" blocks approaches the value of "1" at about 2.8 V, which indicates that all of the drain select transistors turn "on" when the drain select gate bias voltage $V_{DSG}$ is set to 2.8 V. The second curve 304 associated with the "defective" blocks shows a general decline as the drain select gate bias voltage $V_{DSG}$ is increased, which indicates an increasing amount of drain select transistors turning on, which in turn may indicate a gate short on the drain select transistors.

An arrow 306 is positioned at about 3.8 V, which may indicate an initial or default voltage level of the drain select gate bias voltage $V_{DSG}$ that is supplied on the drain select gate bias line DSG when the ECC module 122 detects a UECC. As shown in FIG. 3, the number of drain select transistors that turn on continues to increase as the drain select gate bias voltage $V_{DSG}$ increases past the initial 3.8 V level. An arrow 308 is positioned at about 5.4 V, which may indicate a voltage level for the drain select gate bias voltage $V_{DSG}$ that yields a match, at least one that is within an acceptable margin of error. Accordingly, the second distribution curve 304 shown in FIG. 3 illustrates that in the event of a gate short on a drain select transistor, the voltage level of the drain select gate bias voltage $V_{DSG}$ may be increased to about 5.4 V for data recovery.

FIG. 4 shows a graph of curve 402 that indicates a number of bit errors as a function of the drain select gate bias voltage $V_{DSG}$. The decreasing slope of the curve 402 indicates that the number of bit errors decreases as the drain select gate bias voltage $V_{DSG}$ increases. A line 404 positioned at about 300 bit errors may indicate an acceptable number of bit errors for ECC correction. Voltage levels for the drain select gate bias voltage $V_{DSG}$ set at or above where there curve 402 intersects the line 404 may be used to overcome gate shorts on the drain select transistors.

Referring back to FIG. 1, in addition to a subsequent read operation being performed in response to a match, the storage module controller 110, such as through the firmware module 120, may determine to terminate or retire the one or more blocks and/or one or more pages that yielded a UECC due to the gate short, which may include instructing the memory controller 134 to move or copy the data to a different block or other area of the memory array 132, and/or which may include identifying the one or more blocks and/or pages as being retired so that data is no longer programmed to or read from them. In some example configurations, the storage module controller 110 may track the number of times that data read from the one or more blocks or pages was recovered through gate short detection. When the number reaches a threshold level, the storage module controller 110 may determine to retire or terminate the one or more blocks or pages. For some examples, the threshold level may be one. That is, if data recovery following gate short detection on the one or more blocks or pages occurs a second time, those one or more blocks or pages may be retired terminated. Other numbers of times may alternatively be used.

In addition or alternatively, after a subsequent read operation is performed in response to a match, the on-chip voltage generator 138 and/or the off-chip voltage generator 140 may be reset such that any gate bias voltage levels that were increased or stepped during gate short detection up may be returned or reset to their initial or default values. The voltage levels may be reset so that subsequent operations are not performed on "normal" memory blocks using elevated voltage levels.

Figure 5A:
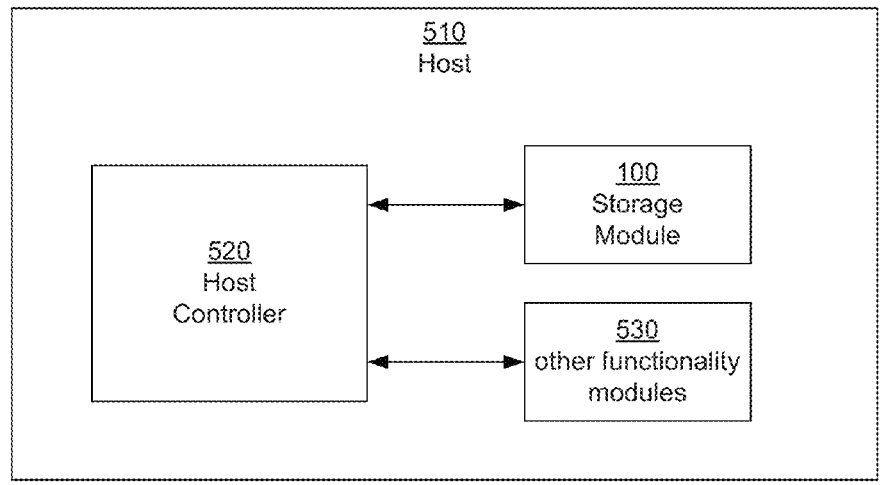
FIG. 5A is a block diagram of the storage module shown in FIG. 1 embedded in a host.
Figure 5B:
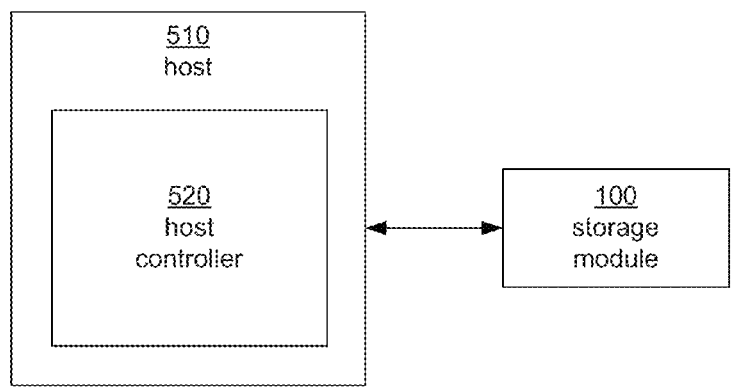
FIG. 5B is a block diagram of the storage module shown in FIG. 1 removably connected with a host.

For some example configurations, the storage module 100 may be implemented with a host by being an embedded device of the host or by being removably connected with a host. FIGS. 5A and 5B show these implementations. As shown in FIG. 5A, the storage module 100 may be embedded in a host 510. In addition to embedding the storage module 100, the host 510 may have a host controller 520. That is, the host 510 may embody the host controller 520 and the storage module 100, such that the host controller 520 interfaces with the embedded storage module 100 to manage its operations. For example, the storage module 100 can take the form of an iNAND™ eSD/eMMC embedded flash drive by SanDisk Corporation. The host controller 520 may interface with the embedded storage module 100 using the host interface 518. Additionally, when the storage module 100 is embedded in the host 510, some or all of the functions performed by the controller 510 in the storage module 100 may instead be performed by the host controller 520.

The host 510 can take any form, such as, but not limited to, a solid state drive (SSD), a hybrid storage module (having both a hard disk drive and a solid state drive), a memory caching system, a mobile phone, a tablet computer, a digital media player, a game device, a personal digital assistant (PDA), a mobile (e.g., notebook, laptop) personal computer (PC), or a book reader, as examples. As shown in FIG. 5A, the host 510 can include optional other functionality modules 530. For example, if the host 510 is a mobile phone, the other functionality modules 530 can include hardware and/or software components to make and place telephone calls. As another example, if the host 510 has network connectivity capabilities, the other functionality modules 530 can include a network interface. These are just some examples, and other implementations can be used. Also, the host 510 can include other components (e.g., an audio output, input-output ports, etc.) that are not shown in FIG. 5A to simplify the drawing.

As shown in FIG. 5B, instead of being an embedded device in a host, the storage module 100 may have physical and electrical connectors that allow the storage module 100 to be removably connected to a host 540 (having a host controller 545) via mating connectors. As such, the storage module 100 may be a separate device from (and is not embedded in) the host 540. In this example, the storage module 100 can be a removable memory device, such as a Secure Digital (SD) memory card, a microSD memory card, a Compact Flash (CF) memory card, or a universal serial bus (USB) device (with a USB interface to the host), and the host 540 is a separate device, such as a mobile phone, a tablet computer, a digital media player, a game device, a personal digital assistant (PDA), a mobile (e.g., notebook, laptop) personal computer (PC), or a book reader, for example.

Figure 6:
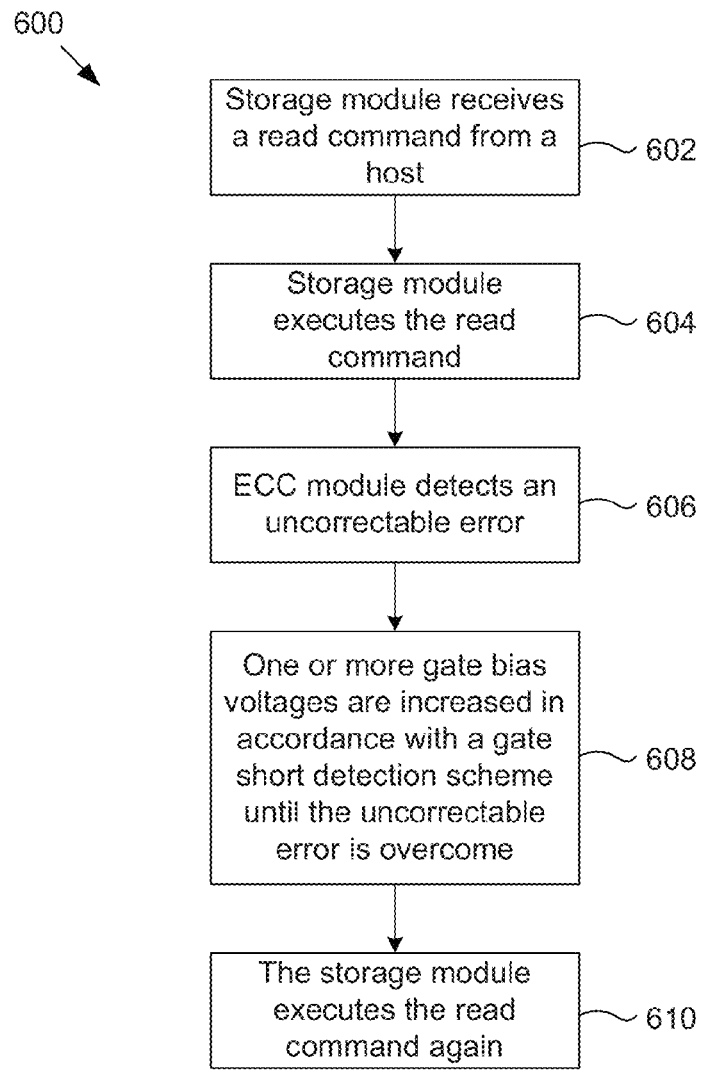
FIG. 6 is a flow chart of a method of overcoming an uncorrectable error due to a gate short.

FIG. 6 shows a flow chart of an example method 600 of overcoming an uncorrectable error due to a gate short in a NAND-type flash memory array of a storage module. At block 602, the storage module may receive a read command from a host. For example, the storage module may have a storage module controller that receives the read command through a host interface. The read command may be a command to read a set of data stored in the NAND-type flash memory array. At block 604, the storage module may execute the read command. For example, the storage module controller may send instructions to execute the read command to a memory controller of the storage module, which may select one or more blocks and/or one or more pages in the memory array to read the set of data. In addition, one or more gate bias voltages may be applied at initial or default levels to gates of transistors in the memory array to sense the set of data. The sensed data set may be stored in a page buffer, which the memory controller may then send to the storage module controller.

At block 606, an ECC module or engine may perform error checking on the set of data that the storage module controller received from the memory controller. Upon performing error checking, the ECC module may detect one or more uncorrectable errors or UECCs for the data set. At block 608, in response to detection of the one or more uncorrectable errors, one or more gate bias voltages may be increased in accordance with a gate short detection scheme until the one or more uncorrectable errors are overcome. Under the gate short detection scheme, all of the wordlines associated with execution of the read command may be unselected. This may be performed by applying a wordline bias voltage $V_{read}$ to the wordlines. In addition, under the gate short detection scheme, one or more of a plurality of different types of transistors of a string in the memory array may be identified for receiving increased gate bias voltage. The different types may include a drain select transistor, a source select transistor, and a floating gate transistor. Additionally, the gate short detection scheme may determine an order of two or more of the different types of transistors in which the increased gate bias voltage will be received.

The memory controller may sense a set of data when all of the wordlines are unselected and when the increased gate bias voltage is supplied to the memory array. In addition, the memory controller may determine that the uncorrectable error is overcome when a difference between the sensed set of data and an expected set of data is within an acceptable margin of error for successful execution of the read command. When the increased gate bias voltage yields a difference that is within an acceptable margin of error, then at block 610, the storage module may execute the read command again, with the gate bias voltage being at the increased level.

Figure 7:
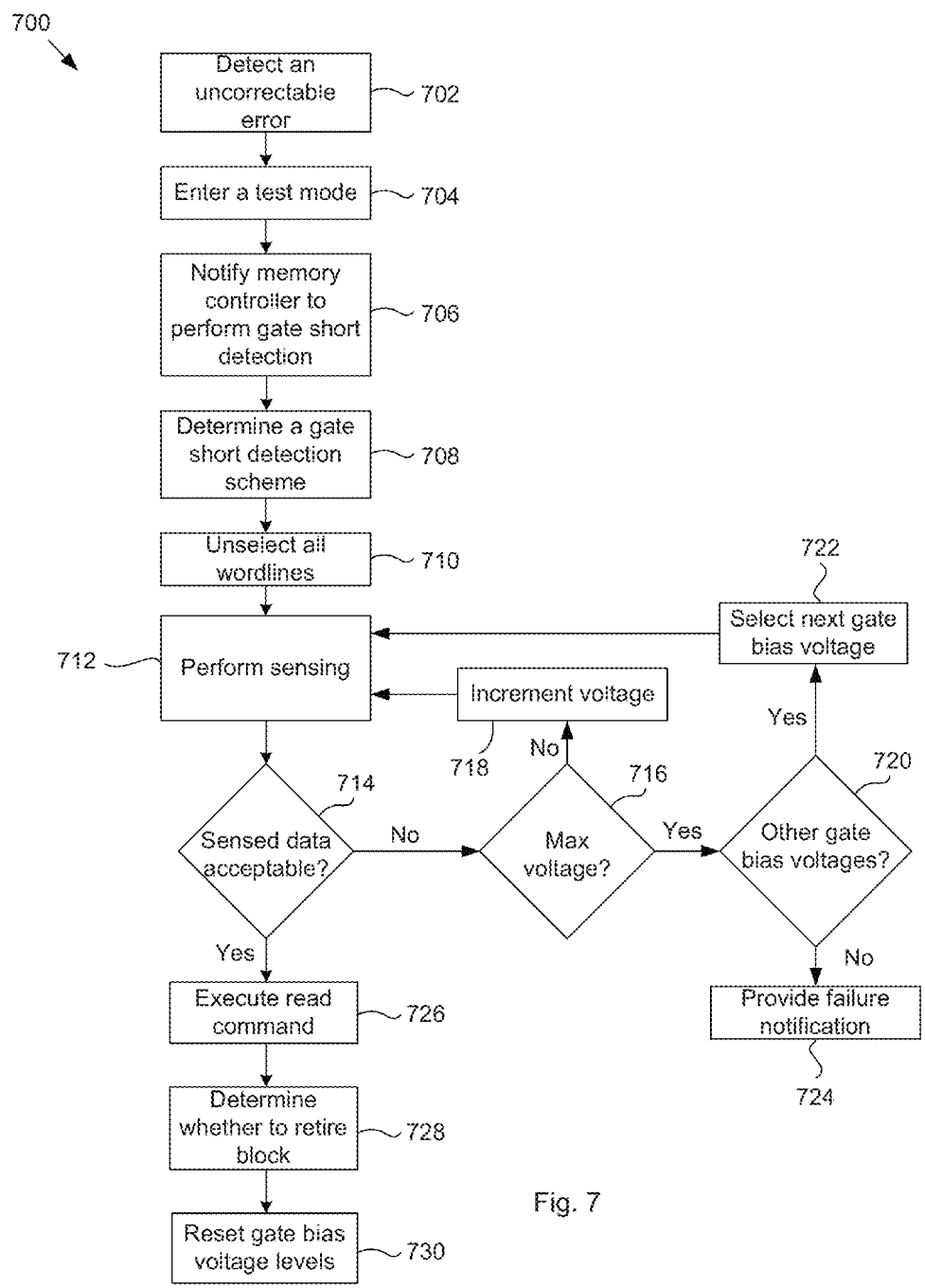
FIG. 7 is a flow chart of another method of overcoming an uncorrectable error due to a gate short.

FIG. 7 shows a flow chart of another example method 700 of overcoming an uncorrectable error due to a gate short in a NAND-type flash memory array of a storage module. At block 702, an ECC module of a storage module controller may detect an uncorrectable error for a first set of data read from the NAND-type flash memory array in response to a read command received by the storage module. At block 704, the storage module may enter a test mode or switch from a user mode to the test mode in response to detecting the uncorrectable error. Entering the test mode may enable the storage module to implement a gate short detection scheme, as previously described. Alternative methods may skip the test mode or may not switch from the user mode to the test mode to implement the gate short detection scheme.

At block 706, a storage module controller, such as through firmware and/or a memory interface, may notify a memory controller, which may be on-chip with the memory array, of the uncorrectable error and instruct the memory controller to perform gate short detection on the memory array. At block 708, the memory controller may identify or determine the gate short detection scheme to perform gate short detection. The gate short detection scheme may identify that the memory controller is to unselect all of the wordlines associated with execution of the read command to perform gate short detection. Additionally, the gate short detection scheme may identify one or more gate bias voltages that are to be increased if the initial or default gate bias voltage levels are insufficient to overcome the uncorrectable error. Additionally, some gate short detection schemes may identify an order in which at least two types of transistors of a string in the memory array are to receive increased gate bias voltages.

At block 710, the memory controller may unselect all of the wordlines associated with execution of the read command in accordance with the gate short detection scheme. Unselecting all of the wordlines may include applying a wordline bias voltage to the wordlines associated with execution of the read command. At block 712, the memory controller may sense a second set of data when all of the wordlines are unselected. To do so, other gate bias voltages, including source and drain select gate bias voltages, may be supplied to source and drain select transistors in the memory array to induce current flow through strings in the memory array. The gate bias voltages may be initially supplied at initial or default levels. The presence or absence of the current flow through the strings may be sensed and corresponding data may be stored in a page buffer as the second set of data.

At block 714, the memory controller may determine whether the gate bias voltage levels currently being supplied to the memory array are sufficient to overcome the uncorrectable error identified by the ECC module at block 702. The memory controller may do so by comparing the second set of data with a third, expected set of data. The third set of data may have values that are expected or anticipated to be sensed from the memory array when all of the wordlines are unselected. An example third set of data may include all logic "1" values, otherwise referred to as FF data. When comparing the sensed second set of data with the expected third set of data, the memory controller may determine a difference between the second and third data sets. If the difference falls within an acceptable margin of error, the memory controller may determine that gate bias voltage levels applied to the memory array at block 714 are sufficient to overcome the uncorrectable error in that there is either a perfect match between the second and third sets of data, or that any difference between the second and third sets of data is indicative of an amount of bit errors that may be correctable by the ECC module. Alternatively, if there is a difference between the second and third sets of data that falls outside of the acceptable margin of error, then the memory controller may determine that the current gate bias voltage levels supplied to the memory array at block 714 are insufficient to overcome the uncorrectable error.

If the memory controller determines that the gate bias voltage levels are insufficient, then at block 716, the memory controller may determine whether the voltage level of the gate bias voltage to be increased as identified in the gate short detection scheme is at a predetermined maximum level. If the gate bias voltage is not at the maximum level, then at block 718, the gate bias voltage may be increased or incremented to a next level. For some example methods, the increment in voltage may correspond to a single DAC voltage level, as previously described. The method may then proceed back to block 712, where another or new second set of sensed data may be obtained from the memory array with the gate bias voltage being supplied at the next voltage level. A determination of whether the incremented gate bias voltage level is sufficient to overcome the uncorrected error may then be made at block 714. At this point in the method 700, although the incremented gate bias voltage level is greater than the initial level, if it is insufficient to overcome the uncorrected error, then the level may be less than a level needed to overcome a gate short in the memory array.

Alternatively, if at block 716 the gate bias voltage is at a maximum level, then the gate bias voltage may not be increased or incremented any higher, and at block 720, the memory controller may determine whether there are other gate bias voltages to be increased in accordance with the gate short detection scheme. If so, then at block 722, a next gate bias voltage may be increased to a next level and the method then may proceed back to block 712 to sense another second set of data. Also, at block 722, for some example methods, the previous gate bias voltage may be reset to its initial level. Alternatively, if there are no other gate bias voltages to increase, then at block 724, the memory controller may provide a failure notification to the storage module controller, indicating that increasing or overdriving the gate bias voltage could not overcome the uncorrectable error. The failure message may indicate that the uncorrectable error is not due to a gate short, or that if there is a gate short, increasing or overdriving the gate bias voltage could not remedy the gate short and recover the data.

Referring back to block 714, if the memory controller determines that the gate bias voltage supplied to the memory array is sufficient to overcome the uncorrectable error, then at block 726, the read command may be executed (or re-executed). The read command executed at block 726 may be executed with the gate biasing voltages being supplied at the levels used the last time the memory controller sensed the second set of data at block 712. For example, if the gate bias voltage was increased to a level higher than the initial level in order for the memory controller to identify that the uncorrectable error can be overcome at block 714, then that increased voltage level may be used when executing the read command at block 726. Additionally, at block 726, after executing the read command, the ECC module may perform error correction on the read data to correct any errors and/or to ensure that there are not any uncorrectable errors for the read data.

At block 728, the storage module controller may determine whether to retire the block or page in the memory array from which the data was read at block 726. To do so, the storage module may maintain a count of the number of times that an uncorrectable error was identified and subsequently overcome using gate short detection. If a threshold number is met, then the storage module controller may retire that block or page in the memory array due to that block or page having repeated gate shorts. At block 730, any gate bias voltage levels increased from their initial or default levels may be reset to the initial or default values.

It is intended that the foregoing detailed description be understood as an illustration of selected forms that the embodiments can take and does not intend to limit the claims that follow. Also, some of the following claims may state that a component is operative to perform a certain function or configured for a certain task. It should be noted that these are not restrictive limitations. It should also be noted that the acts recited in the claims can be performed in any order—not necessarily in the order in which they are recited. Additionally, any aspect of any of the preferred embodiments described herein can be used alone or in combination with one another. In sum, although the present invention has been described in considerable detail with reference to certain embodiments thereof, other versions are possible. Therefore, the spirit and scope of the appended claims should not be limited to the description of the embodiments contained herein.

We claim:

1. A method of recovering data from a NAND-type flash memory array responsive to a read command to read a first set of data, the method comprising:
   in response to an uncorrectable error determined by an error correction code (ECC) module for the first set of data read from the NAND-type flash memory array:
      increasing a gate bias voltage supplied to the NAND-type flash memory array from an initial voltage level to an increased voltage level;
      unselecting, with at least one controller, all wordlines in the NAND-type flash memory array that are associated with reading the first set of data;
      sensing, with the at least one controller, a second set of data when the gate bias voltage is being supplied at the increased voltage level and when all of the wordlines associated with reading the first set of data are unselected;
      comparing, with the at least one controller, the second set of data with a third set of data, the third set of data being an expected set of data when all of the wordlines associated with reading the first set of data are unselected; and
   determining, with the at least one controller, that the uncorrectable error is overcome in response to the gate bias voltage being supplied to the NAND-type flash memory array at the increased voltage level and comparing the second set of data with the third set of data.

2. The method of claim 1, wherein comparing the second set of data and the third set of data comprises determining, with the at least one controller, a difference between the second set of data and the third, expected set of data, and
   wherein determining that the uncorrectable error is overcome comprises determining, with the at least one controller, that the difference is within an acceptable margin of error for successful execution of the read command.

3. The method of claim 1, further comprising:
   determining, with the at least one controller, that the uncorrectable error is not overcome in response to the gate bias voltage being supplied to the NAND-type flash memory array at a stepped-up voltage level, wherein the stepped-up voltage level is greater than the initial voltage level and less than the increased voltage level.

4. The method of claim 1, wherein the gate bias voltage comprises one of a plurality of gate bias voltages that are supplied to the NAND-type flash memory array to execute the read command, and wherein increasing the gate bias voltage comprises increasing the gate bias voltage from the initial voltage level to the increased voltage level while maintaining constant initial voltage levels for the other of the plurality of gate bias voltages.

5. The method of claim 1, wherein the gate bias voltage comprises at least one of:
   a drain select gate bias voltage supplied to a gate of a drain select transistor in the NAND-type flash memory array;
   a source select gate bias voltage supplied to a gate of a source select transistor in the NAND-type flash memory array; or
   a wordline bias voltage supplied to a control gate of a floating gate transistor in the NAND-type flash memory array.

6. The method of claim 1, further comprising:
   executing, with the at least one controller, the read command with the gate bias voltage being supplied at the increased voltage level.

7. The method of claim 1, further comprising:
resetting the gate bias voltage to the initial voltage level after executing the read command with the gate bias voltage being supplied at the increased voltage level.

8. A storage module comprising:
a NAND-type flash memory array; and
at least one controller configured to:
receive a read command from a host to read a first set of data from the NAND-type flash memory array;
determine an uncorrectable error for the first set of data in response to an initial execution of the read command;
in response to determination of the uncorrectable error, increase a gate bias voltage supplied to the NAND-type flash memory array from an initial level to an increased level in accordance with a gate short detection scheme, wherein the uncorrectable error is overcome in response to supply of the gate bias voltage to the NAND-type flash memory array at the increased level,
and wherein the gate short detection scheme identifies at least one of a drain select transistor or a source select transistor in the NAND-type flash memory array on which to increase the gate bias voltage in response to the uncorrectable error.

9. The storage module of claim 8, wherein the at least one controller is further configured to:
sense a second set of data from the NAND-type flash memory array when the gate bias voltage is being supplied to the NAND-type flash memory array at the increased voltage level;
compare the second set of data with a third set of data, the third set of data being an expected set of data; and
determine that the uncorrectable error is overcome in response to the comparison of the second set of data with the third, expected set of data.

10. The storage module of claim 9, wherein the at least one controller is further configured to:
unselect all wordlines in the NAND-type flash memory array that are associated with execution of the read command; and
sense the second set of data when the gate bias voltage is supplied at the increased voltage level and when all of the wordlines associated with execution of the read command are unselected,
wherein the third, expected set of data comprises values that are expected to be sensed when all of the wordlines associated with executing the read command are unselected.

11. The storage module of claim 9, wherein the comparison of the second set of data with the third set of data comprises a determination of a difference between the second set of data and the third, expected set of data, and
wherein the at least one controller is further configured to determine that the difference is within an acceptable margin of error for successful execution of the read command to determine that the uncorrectable error is overcome.

12. The storage module of claim 9, wherein the at least one controller is further configured to:
determine that the uncorrectable error is not overcome in response to the gate bias voltage being supplied to the NAND-type flash memory array at a stepped-up voltage level, wherein the stepped-up voltage level is greater than the initial voltage level and less than the increased voltage level.

13. The storage module of claim 8, wherein the gate bias voltage comprises one of a plurality of gate bias voltages that are supplied to the NAND-type flash memory array to execute the read command, and wherein the at least one controller is configured to increase the gate bias from the initial voltage level to the increased voltage level while maintaining constant initial voltage levels for the other of the plurality of gate bias voltages.

14. The storage module of claim 8, wherein the gate short detection scheme further identifies a floating gate transistor on which to increase the gate bias voltage in response to the uncorrectable error.

15. The storage module of claim 14, wherein the gate short detection scheme further identifies an order in which at least two types of transistors receive gate bias voltage at increased levels.

16. The storage module of claim 8, wherein the at least one controller is further configured to:
execute the read command with the gate bias voltage supplied at the increased voltage level.

17. A storage module comprising:
a non-volatile memory module comprising:
a NAND-type flash memory array; and
a memory controller;
a storage module controller in communication with the non-volatile memory module,
wherein the storage module controller is configured to:
determine an uncorrectable error for a first set of data read from the NAND-type flash memory array in response to a read command;
instruct the memory controller to perform gate short detection in response to determination of the uncorrectable error; and
wherein the memory controller, in response to receipt of the instruction, is configured to:
unselect all wordlines in the NAND-type flash memory array associated with execution of the read command;
sense a second set of data when a gate bias voltage is supplied to the NAND-type flash memory at an increased voltage level, the second set of data being sensed when all of the wordlines associated with execution of the read command are unselected; and
determine that the uncorrectable error is overcome based on a comparison of the sensed second set of data with a third set of data, the third set of data being an expected set of data to be sensed when all of the wordlines associated with execution of the read command are unselected.

18. The storage module of claim 17, wherein the storage module controller is further configured to execute the read command with the gate bias voltage supplied to the NAND-type flash memory array at the increased level.

* * * * *